(12) United States Patent
Kadota et al.

(10) Patent No.: US 6,297,713 B1
(45) Date of Patent: Oct. 2, 2001

(54) SURFACE ACOUSTIC WAVE DEVICE WITH SPLIT ELECTRODES AND OUTERMOST ELECTRODES OF A DIFFERENT WIDTH THAN THE SPLIT ELECTRODES

(75) Inventors: Michio Kadota, Kyoto; Junya Ago, Nagaokakyo; Hideya Horiuchi, Kyoto; Mamoru Ikeura, Nagaokakyo, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/321,507

(22) Filed: May 27, 1999

(30) Foreign Application Priority Data

Jun. 1, 1998 (JP) .................................................. 10-151725
Apr. 28, 1999 (JP) .................................................. 11-121035

(51) Int. Cl.[7] ......................................................... H03H 9/64
(52) U.S. Cl. ....................... 333/133; 333/193; 310/313 B
(58) Field of Search ........................................ 333/193, 133; 310/313 R, 313 B, 313 C, 313 D

(56) References Cited

U.S. PATENT DOCUMENTS

| 5,184,042 | * | 2/1993 | Kadota et al. ............... 333/193 X |
| 5,521,565 | | 5/1996 | Anemogiannis ............... 333/195 |
| 5,838,217 | * | 11/1998 | Kadota et al. ............... 333/193 |
| 5,952,899 | * | 9/1999 | Kadota et al. ............... 333/193 |
| 6,127,769 | * | 10/2000 | Kadota et al. ............... 333/193 X |
| 6,137,380 | * | 10/2000 | Ushiroku et al. ............. 333/193 |

FOREIGN PATENT DOCUMENTS

| 0 751 615 | 1/1997 | (EP) . |
| 2 287 580 A | 9/1995 | (GB) . |
| 60-41809 | 5/1985 | (JP) . |
| 3-228418 | 10/1991 | (JP) . |
| WO 90/03692 | 4/1990 | (WO) . |

* cited by examiner

*Primary Examiner*—Robert Pascal
*Assistant Examiner*—Barbara Summons
(74) *Attorney, Agent, or Firm*—Keating & Bennett LLP

(57) ABSTRACT

A surface acoustic wave device is constructed to operate using an SH type surface acoustic wave and so that the surface acoustic wave is reflected by two opposite edges of the device. The surface acoustic wave device includes a piezoelectric substrate having first and second main surfaces and the two edges arranged opposite to each other and which connect the first and second main surfaces, respectively, and an interdigital transducer having a pair of interdigital electrodes provided on the first main surface of the piezoelectric substrate and arranged so that the electrode fingers thereof are interdigitated with each other. The electrode fingers of the interdigital electrodes include a plurality of split electrodes, except for the electrode fingers located at the outermost sides in the surface acoustic wave propagation direction. The electrode fingers on the outermost sides have a width that is different from that of the split electrodes.

19 Claims, 17 Drawing Sheets

SURFACE ACOUSTIC WAVE DEVICE WITH SPLIT ELECTRODES AND OUTERMOST ELECTRODES OF A DIFFERENT WIDTH THAN THE SPLIT ELECTRODES

BACKGROUND OF THE INVENTION

1. Field of the Invention

The present invention relates to a surface acoustic wave device which operates by generating a surface acoustic wave containing as a major component an SH (shear horizontal) type wave such as a BGS (Bleustein-Gulyaev-Shimizu) wave, a Love wave, or other such wave, and, more particularly, to an edge-reflection type surface acoustic wave device.

2. Description of the Related Art

Surface acoustic wave devices are used in a wide variety of devices such as resonators, bandpass filters, and other such electronic components. With ordinary surface acoustic wave devices, it is necessary to form reflectors on both sides of an interdigital transducer (IDT), which necessarily increases the size of surface acoustic wave devices.

In order to cope with this problem, there has been proposed an edge-reflection type resonator which uses an SH type surface acoustic wave. In the edge-reflection type resonator, an IDT is disposed on a piezoelectric substrate. The SH type surface acoustic wave excited by the IDT is reflected between the edges of the piezoelectric substrate which are located on opposite sides of the IDT. Thus, the two edges opposite to each other are used to reflect the surface acoustic waves instead of using the reflectors to reflect the waves. Accordingly, it is unnecessary to provide the reflectors.

An example of the above-described edge-reflection type resonator is disclosed in Japanese Unexamined Patent Publication No. 60-41809. In this publication, there is disclosed an edge-reflection type resonator which utilizes an SH type surface acoustic wave. FIG. 8 is a schematic plan view of an edge-reflection type resonator which is described as a conventional example in the above prior art publication.

An edge-reflection type resonator 51 includes a piezoelectric substrate 52 having a rectangular plate shape. On the upper surface 52a thereof, a pair of interdigital electrodes (comb-shaped electrodes) 53 and 54 are provided so as to define one IDT. The interdigital electrodes 53 and 54 have a plurality of electrode fingers, respectively, which are interdigitated with each other. In the edge-reflection type resonator 51, each of the electrode fingers of the interdigital electrodes 53 and 54 is composed of a split electrode pair, that is, two split electrodes, except for the electrode fingers 53a and 53c which are located at the outermost sides in the surface acoustic wave propagation direction. For example, the electrode finger 53b of the interdigital electrode 53 is composed of split electrodes 53b1 and 53b2. Each of the electrode fingers 54a–54c of the interdigital electrode 54 is composed of a pair of two split electrodes, that is, 54a1 and 54a2, 54b1 and 54b2, and 54c1 and 54c2, respectively.

The surface acoustic wave propagation direction is perpendicular to the lengthwise direction of the electrode fingers 53a–53c and 54a–54c. The excited surface acoustic wave is reflected between the two edges 52b and 52c disposed opposite to each other, and thereby, resonant characteristics can be obtained.

As described above, by use of the electrode fingers, each composed of two split electrodes, that is, a pair of the split electrodes, the desired band characteristics, which can not be obtained if the ordinary single type electrode fingers are used, can be attained.

In the conventional edge-reflection type resonator 51 as shown in FIG. 8, the ratio of each electrode finger to the gap between the electrode fingers is 1:1, though it is not clearly stated in the above prior art, and ordinarily, the width of the split electrode is $\lambda/8$ in which $\lambda$ is the wave length of an excited surface acoustic wave. In the prior art, the widths of the electrode fingers 53a and 53c at the outermost sides in the surface acoustic wave propagation direction are equal to the width of the respective split electrode fingers which constitute the remaining electrode fingers. Further, the resonator 51 is arranged so that the reflection end surfaces are located at the centers of a set of the two electrode fingers which are positioned at the outermost sides, respectively, or the distance between one of the centers and the corresponding reflection end-surfaces are an integral multiple of $\lambda/2$.

However, in the case of the edge-reflection type resonator constructed according to the above-described prior art, there is a problem that the ratio of the anti-resonant resistance Ra to the resonant resistance Rr, that is, the ratio of "the top" to "the bottom" is not sufficient. In addition, there is a problem that unnecessary ripples are produced in the frequency characteristics, and good band characteristics can not be achieved.

SUMMARY OF THE INVENTION

To overcome the problems described above, preferred embodiments of the present invention provide an edge-reflection type surface acoustic wave device such as a resonator, a filter or other component, including electrode fingers each having two split electrodes (electrodes of a double electrode type) of which the ratio of the anti-resonant resistance to the resonant resistance, that is, the ratio of "the top" to "the bottom" is very high, and so that undesirable ripples of the frequency characteristics are prevented and so that the band is significantly narrowed.

According to one preferred embodiment of the present invention, an edge-reflection type surface acoustic wave device which is constructed to operate by generating an SH type surface acoustic wave and so that the surface acoustic wave is reflected by its two opposite edges, includes a piezoelectric substrate having first and second main surfaces and the two end surfaces opposite to each other which connect the first and second main surfaces, respectively, and an IDT including a pair of interdigital electrodes disposed on the first main surface of the piezoelectric substrate and arranged so that electrode fingers thereof are interdigitated with each other. Each of the electrode fingers of the interdigital electrodes preferably includes a plurality of split electrodes, except for the interdigital electrodes located at the opposite sides in the surface acoustic wave propagation direction. The electrode fingers located at the outermost sides have a width that is different from that of the respective split electrodes.

According to the edge-reflection type surface acoustic wave device of preferred embodiments of the present invention, narrow band characteristics which previously could not be obtained in an edge-reflection type surface acoustic wave device including the single type electrode fingers, can now be achieved in the edge-reflection type surface acoustic wave device according to preferred embodiments of the present invention. In addition, by providing the difference in width of the electrode fingers at the outermost sides, the ratio of the anti-resonant resistance to the resonant resistance, that is, the ratio of "the top" to "the bottom" is greatly increased. Further, by devising the above-described difference, undesired ripples in the frequency characteristics are prevented.

Accordingly, the edge-reflection type surface acoustic wave device according to preferred embodiments of the present invention achieve a desired band width and excellent resonant characteristics with almost no ripples. Even if a piezoelectric material having an electromechanical coupling factor corresponding to an intended band is not available, the intended band can be easily achieved by simply adjusting the structure of the above-described interdigital electrodes.

It is preferable that the widths of the electrode fingers at the outermost sides in the surface acoustic wave propagation direction are more than about $\lambda/8$, so that the ratio of the anti-resonant resistance to the resonant resistance is significantly increased, and the bandwidth is greatly enlarged. Further, undesirable ripples, which may appear on both sides of the main response, are effectively prevented. Thus, the edge-reflection type surface acoustic wave device having excellent frequency characteristics can be provided.

By adjusting the widths of the electrode fingers at the outermost sides in the surface acoustic wave propagation direction to be in the range of about $\lambda/8$ to about $\lambda/4$, ripples on both sides of the pass-band are prevented. More preferably, by adjusting the widths of the electrode fingers at the outermost sides in the surface acoustic wave propagation direction to be in the range of about $(3/16)\lambda \pm \lambda/32$, the edge-reflection type surface acoustic wave device with almost no ripples and excellent frequency characteristics can be provided.

Further, by using the split electrodes as the electrode fingers of the interdigital electrodes of the surface acoustic wave device having filter characteristics and generating SH type surface acoustic waves, the band is significantly narrowed with substantially no deterioration of the insertion loss.

Further, the surface acoustic wave device according to preferred embodiments of the present invention can be used in a duplexer and a communication device as described above. Since the surface acoustic wave device of preferred embodiments of the present invention has a very compact size, the duplexer and the communication device are greatly miniaturized.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
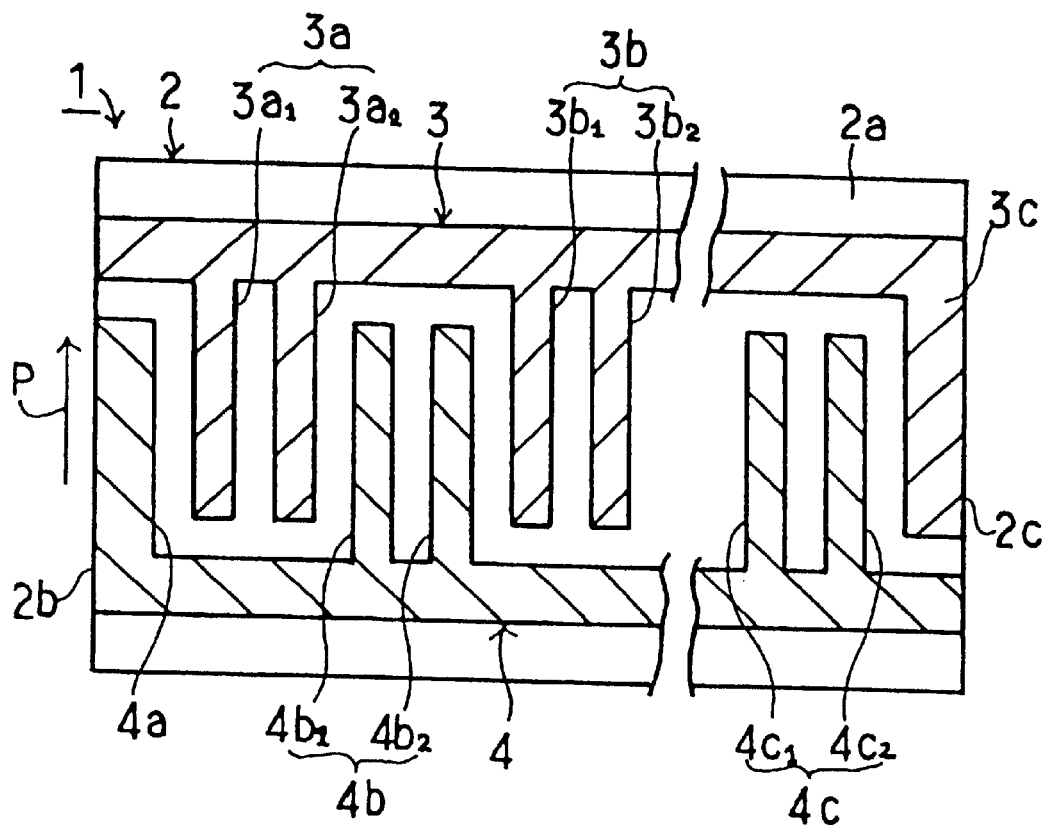
FIG. 1 is a plan view showing an edge-reflection type surface acoustic wave device according to one preferred embodiment of the present invention.

FIG. 1 is a plan view showing an edge-reflection type surface acoustic wave device according to a first preferred embodiment of the present invention.

An edge-reflection type surface acoustic wave device 1 includes a piezoelectric substrate 2 having a substantially rectangular plate shape. The piezoelectric substrate 2 may be made of a piezoelectric single crystal of LiTaO3, LiNbO3, or other suitable material, or made of a piezoelectric ceramic such as lead titanate zirconate type ceramic, for example.

If the piezoelectric substrate 2 is made of piezoelectric ceramic material, the piezoelectric substrate 2 is subjected to a polarization treatment so as to be polarized in the direction indicated by arrow P in FIG. 1, that is, polarized in a direction that is substantially parallel to the edges 2b and 2c of the piezoelectric substrate 2.

On the upper surface 2a of the piezoelectric substrate 2, interdigital electrodes (comb-shaped electrodes) 3 and 4 are provided. The interdigital electrodes 3 and 4 define an IDT.

The interdigital electrode 3 includes electrode fingers 3a, 3b, and 3c. The interdigital electrode 4 has electrode fingers 4a, 4b, and 4c. The plurality of electrode fingers 3a–3c of the interdigital electrode 3 are arranged so as to be inserted between the plurality of electrode fingers 4a–4c of the interdigital electrode 4, respectively. These interdigital electrodes 3 and 4 are formed by patterning a suitable metallic material such as aluminum or other electrode material.

Each of the electrode fingers 3a, 3b, 4b, and 4c of the interdigital electrodes 3 and 4 includes two split electrodes. That is, referring to the electrode finger 3a as a typical example, the electrode finger 3a is preferably made up of two split electrodes 3a1 and 3a2. In general, the split electrodes 3a1 and 3a2 preferably have a width of about $\lambda/8$ in which $\lambda$ represents the wave-length of the surface acoustic wave.

The electrode fingers 3b, 4b, and 4c, made up of two split electrodes, that is, 3b1 and 3b2, 4b1 and 4b2, and 4c1 and 4c2, respectively, are configured similarly to the electrode fingers 3a1 and 3a2.

The edge-reflection type surface acoustic wave device of the present preferred embodiment is constructed such that the widths of the electrode fingers 4a and 3c positioned at the outermost sides in the surface acoustic wave propagation direction differ from the widths of the split electrodes 3a1 and 3a2. The widths of the electrode fingers 4a and 3c positioned at the outermost sides are preferably more than about $\lambda/8$, by which the ratio of an anti-resonant resistance Ra to a resonant resistance Rr is greatly increased, and undesirable ripples which normally will appear in the frequency range outside the frequency characteristic band are prevented. This will be described later with reference to a specific experimental example.

In the edge-reflection type surface acoustic wave device of the present preferred embodiment, with an alternating voltage applied between the interdigital electrodes 3 and 4, the surface acoustic wave is excited. The surface acoustic wave is reflected from the end surfaces 2b and 2c, and thereby, the desired frequency characteristics are achieved. In addition, in the edge-reflection type surface acoustic wave device 1 of the present preferred embodiment, the electrode fingers 3a, 3b, 4b, and 4c are each preferably composed of two split electrodes, respectively. Thus, the desired band characteristics, which previously could not be obtained by use of the edge-reflection type surface acoustic wave device containing single electrodes, can be realized with preferred embodiments of the present invention. This will be described in more detail with reference to FIGS. 2 and 3.

Figure 2:
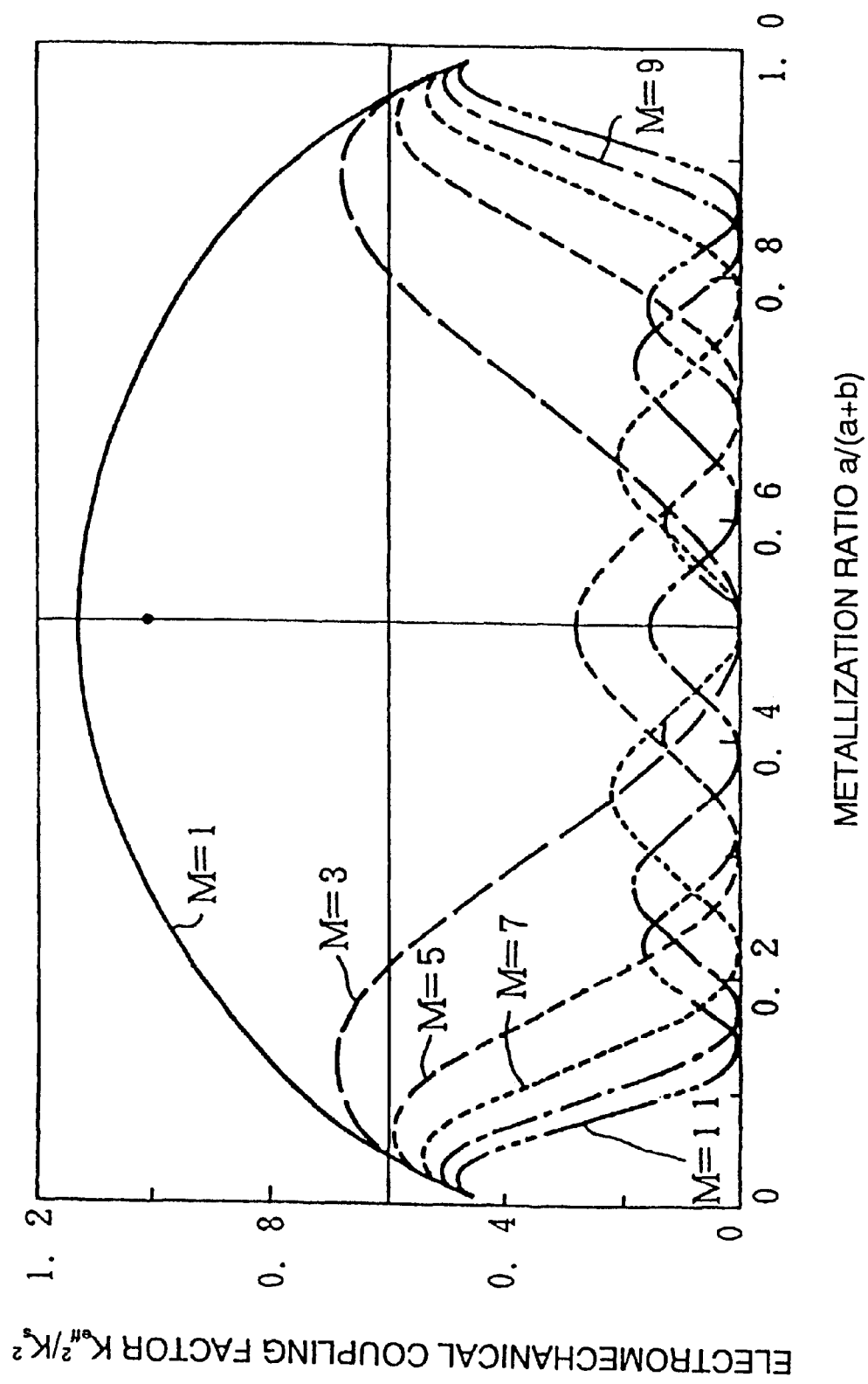
FIG. 2 is a graph showing the relationship between the metallization ratios of the electrode fingers in the edge-reflection type surface acoustic wave device including single type electrode fingers, its electromechanical coupling factors, and the excited surface acoustic waves.
Figure 3:
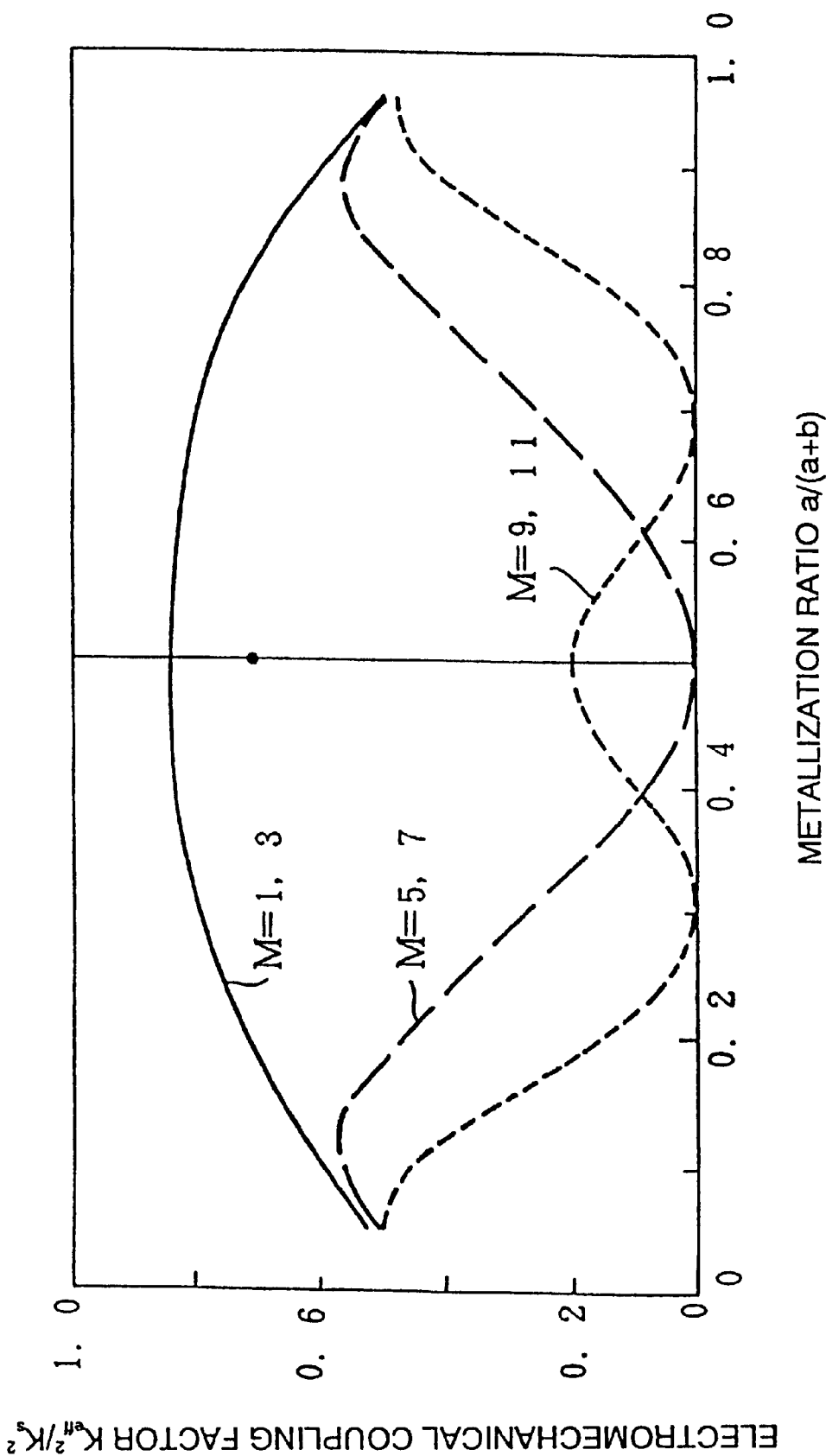
FIG. 3 is a graph showing the relationship between the metallization ratios of the electrode fingers in the edge-reflection type surface acoustic wave device of the preferred embodiment shown in FIG. 1, its electromechanical coupling factors, and the excited surface acoustic waves.

FIG. 2 is a graph illustrating the relationship between the metallization ratio of the electrode finger of an edge-reflection type surface acoustic wave device including a single type electrode finger, and its electromechanical coupling factor depending on the mode of the excited surface acoustic wave. FIG. 3 is a graph illustrating the relationship between the metallization ratio of the split electrode of the edge-reflection type surface acoustic wave device 1 according to the preferred embodiment shown in FIG. 1 and its electromechanical coupling factor depending on the mode of the excited surface acoustic wave.

The metallization ratio of the electrode finger is defined as a value expressed by a/(a+b) in which "a" represents the dimension in the width direction of an electrode finger and "b" the distance between the electrode finger and an adjacent electrode finger, that is, the gap between the electrode fingers excluding an electrode. In the edge-reflection type surface acoustic wave device 1 of the present preferred embodiment, the metallization ratio is defined as a value expressed by a/(a+b) where "a" represents the width of the split electrodes, and "b" represents the gap size in the width direction between the split electrodes of the electrode finger, excluding an electrode.

The ks of $k_{eff}^2/ks^2$ plotted as the ordinate in FIG. 2 and FIG. 3 represents the electromechanical coupling factor of the piezoelectric substrate. The $k_{eff}$ represents the effective electromechanical coupling factor excited by the interdigital electrode. As seen in FIGS. 2 and 3, the $k_{eff}$ of the single electrode has a value higher than that of the split electrodes. The band of a resonator is proportional to $k_{eff}^2$. Accordingly, by use of the split electrodes, a narrower band of the resonator, that is, about 70% of the band of the resonator including the single electrode, is obtained.

The characteristics illustrated in FIG. 2 are obtained when the surface acoustic wave device containing a piezoelectric substrate and including single type electrode fingers has a number N of electrode finger pairs being equal to 20.

In FIGS. 2 and 3, the characteristics designated by M=1, 3, 7, 9, and 11 are the characteristics of the fundamental wave, the treble wave, the fivefold wave, the sevenfold wave, the ninefold wave, and the elevenfold wave, respectively.

As shown in FIG. 2, in the case of the surface acoustic wave device including the single type electrode fingers, a high electromechanical coupling factor is obtained for the fundamental wave, in the metallization ratio range of about 0.25 to about 0.75. However, in the case of higher harmonics, such as the treble or higher wave, a high electromechanical coupling factor can not be achieved.

On the other hand, as seen in FIG. 3, in the surface acoustic wave device 1 including two split electrodes, a high electromechanical coupling factor can be achieved, in the metallization ratio range of about 0.25 to about 0.75 not only for the fundamental wave but also for the treble wave.

Accordingly, in the edge-reflection type surface acoustic wave device 1, all of the excited surface acoustic waves including the treble wave can be utilized effectively.

In the edge-reflection type surface acoustic wave device 1 of the present preferred embodiment, the remaining electrode fingers except for the electrode fingers 4a and 3c provided at the outermost sides in the surface acoustic wave propagation direction are pair-electrodes each of which is composed of two split electrodes. The Inventors of the present invention investigated the configuration of the electrode fingers 4a and 3c positioned at the outermost sides in the surface acoustic wave propagation direction in the edge-reflection type surface acoustic wave device 1 including the electrode fingers composed of the split electrodes.

In the conventional single electrode type edge-reflection type surface acoustic wave device, the widths of the electrode fingers except for the electrode fingers at the outermost sides in the surface acoustic wave propagation direction are λ/4, and the widths of the electrode fingers at the outermost sides in the surface acoustic wave propagation direction are λ/8. Accordingly, each of the electrode fingers except for the electrode fingers at the outermost sides in the surface acoustic wave propagation direction is formed of two split electrodes, the width of each split electrode is set at λ/8, and the width of each electrode finger at the outermost side in the surface acoustic wave propagation direction is set at λ/16. However, it was confirmed that with such an edge-reflection type surface acoustic wave device as described above, the SH type surface acoustic wave can not be sufficiently excited.

Accordingly, the Inventors further investigated the electrode fingers 4a and 3c at the outermost sides in the surface acoustic wave propagation direction. As a result, it was discovered that if the widths of the electrode fingers 4a and 3c differ from those of the remaining split electrodes, namely, differ from λ/8, and especially, are larger than λ/8, the fundamental wave and the treble wave of the SH type surface acoustic wave can be effectively excited. This will be now described with reference to a specific experimental example.

An example of the edge-reflection type surface acoustic wave device 1 according to the preferred embodiment shown in FIG. 1 includes the piezoelectric substrate 2 made of a piezoelectric ceramic and is constructed so that the distance between the end surfaces 2b and 2c is about 1193 μm, the size in the width direction of each of the split electrodes of the interdigital electrodes 3 and 4 is about 4.2 μm, the total number of the electrode fingers is 142, and the number of the electrode finger pairs is 35.5. In the edge-reflection type surface acoustic wave device 1, for the electrode finger 4a at the outermost side, an electrode wider than about (3/8)λ is disposed on the piezoelectric substrate.

Figure 4:
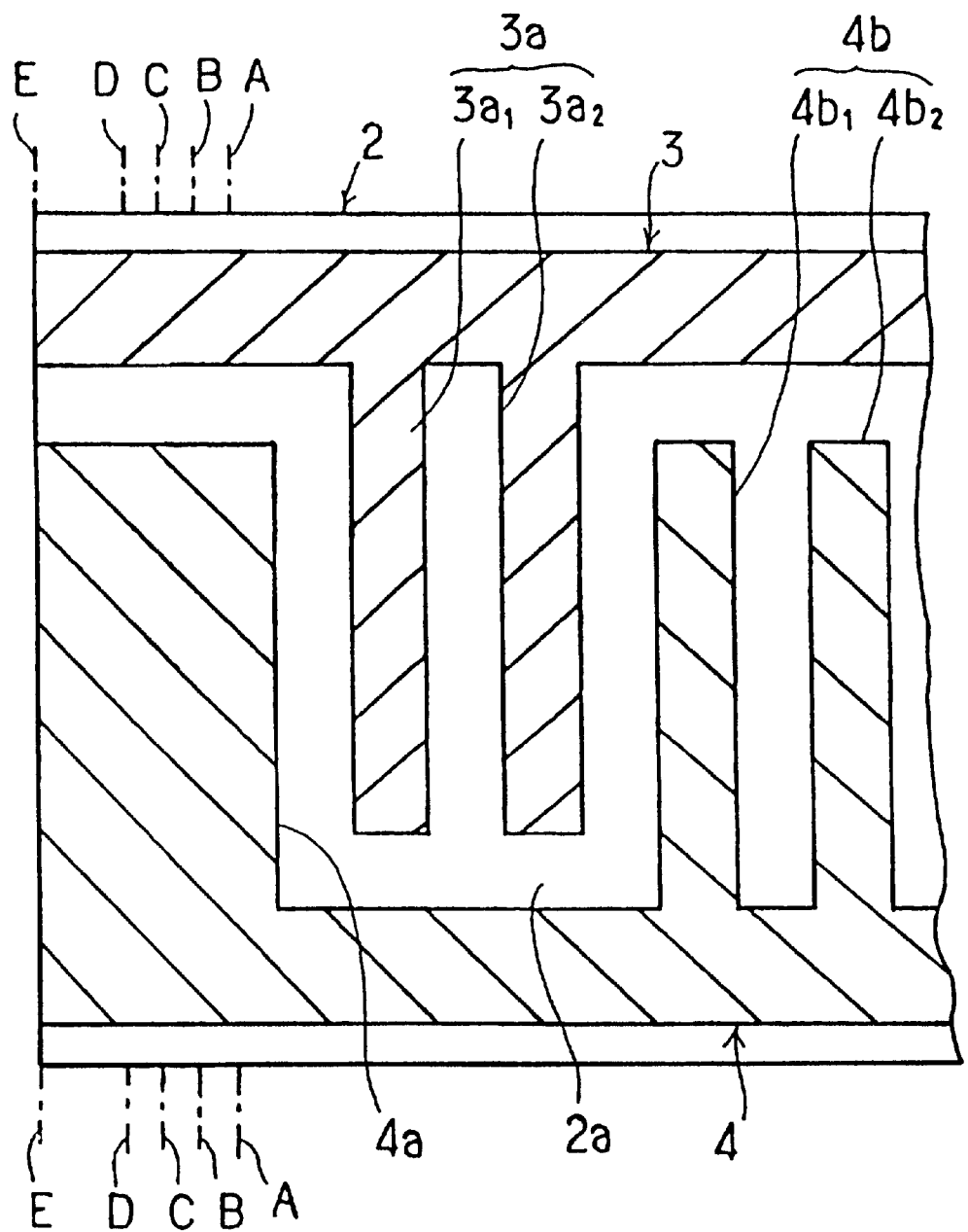
FIG. 4 is a partially cutaway plan view illustrating the process by which, in the edge-reflection type surface acoustic wave device, the piezoelectric substrate is cut so that the electrode fingers at the outermost sides in the surface wave propagation direction having different widths are formed.

In this example, the piezoelectric substrate is cut in the respective positions shown by lines A, B, C, D, and E of FIG. 4 so that the edge surface 2b is formed, and simultaneously, the electrode fingers having different widths are formed. Thus, five kinds of the edge-reflection type surface acoustic wave devices are produced. In this case, the outside edge of the electrode 4a on the outermost side is aligned with the edge 2b. The electrode finger 3c on the other outermost side is similarly configured.

The widths of the electrode fingers 4a at the outermost side, produced by cutting the piezoelectric substrate 2 at the positions shown by the lines A–E are as follows. The widths of the electrode fingers 4a cut at the positions shown by lines A, B, C, D, and E are approximately λ/16, λ/8, (3/16)λ, (1/4)λ, and (5/16)λ, respectively.

Figure 5:
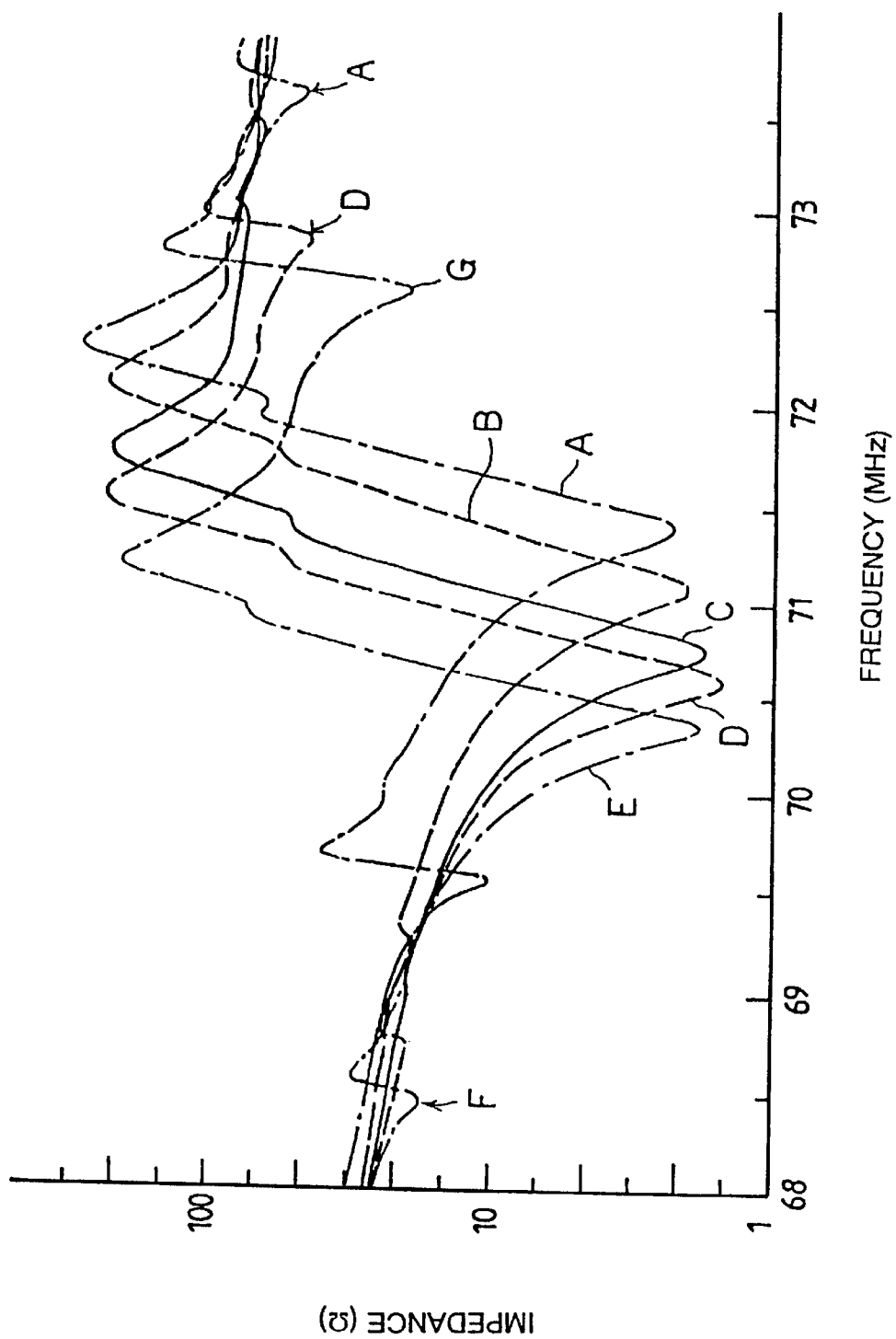
FIG. 5 is a graph which illustrates the impedance-frequency characteristics of the edge-reflection type surface acoustic wave device obtained by cutting away the end surface in the respective positions shown in FIG. 4 to produce the electrode fingers at the outermost side in the surface acoustic wave propagation direction and having different widths.

FIG. 5 is a graph showing the impedance-frequency characteristics of the respective edge-reflection type surface acoustic wave devices formed as described above.

In FIG. 5, the alternate long and short dash line shown by line A represents the characteristics obtained when the widths of the electrodes 4a and 3c at the outermost sides are λ/16, the broken line B represents the characteristics obtained when the widths of the electrodes 4a and 3c are λ/8, the solid line by C represents the characteristics obtained when the width of the electrodes 4a and 3c are (3/16)λ, the broken line by D represents the characteristics obtained when the widths of the electrodes 4a and 3c are λ/4, and the alternate long and short dash line by E represents the characteristics obtained when the widths of the electrodes 4a and 3c are (5/16)λ.

As seen in FIG. 5, with respect to the characteristics indicated by lines C and D, the ratio of the anti-resonant resistance Ra to the resonant resistance Rr is very high, and the surface acoustic wave device with a high Q factor can be achieved. Further, it is seen that much more desirable characteristics are achieved when the widths of the electrode fingers at the outermost sides are larger than about λ/8.

With respect to the characteristic indicated by line E, large ripples, indicated by F and G, appear at the lower frequency range side of the resonant frequency and at the higher frequency side of the anti-resonant frequency. Similarly, in the case of the characteristics indicated by D, ripples also appear outside of the band. However, the ripples are decreased as compared with the characteristic indicated by E. On the other hand, for the characteristic indicated by C, the ripples are considerably reduced and almost eliminated. Thus, it is understood that for the purpose of reducing and eliminating the above-described ripples, the widths of the electrode fingers at the outermost sides in the surface acoustic wave propagation direction are preferably made to have a value of up to λ/4, and more preferably about (3/16)λ.

In FIG. 5, the ripples appearing between the resonances and the anti-resonances are due to the transversal mode, not due to the reflection from the end surfaces.

Figure 6:
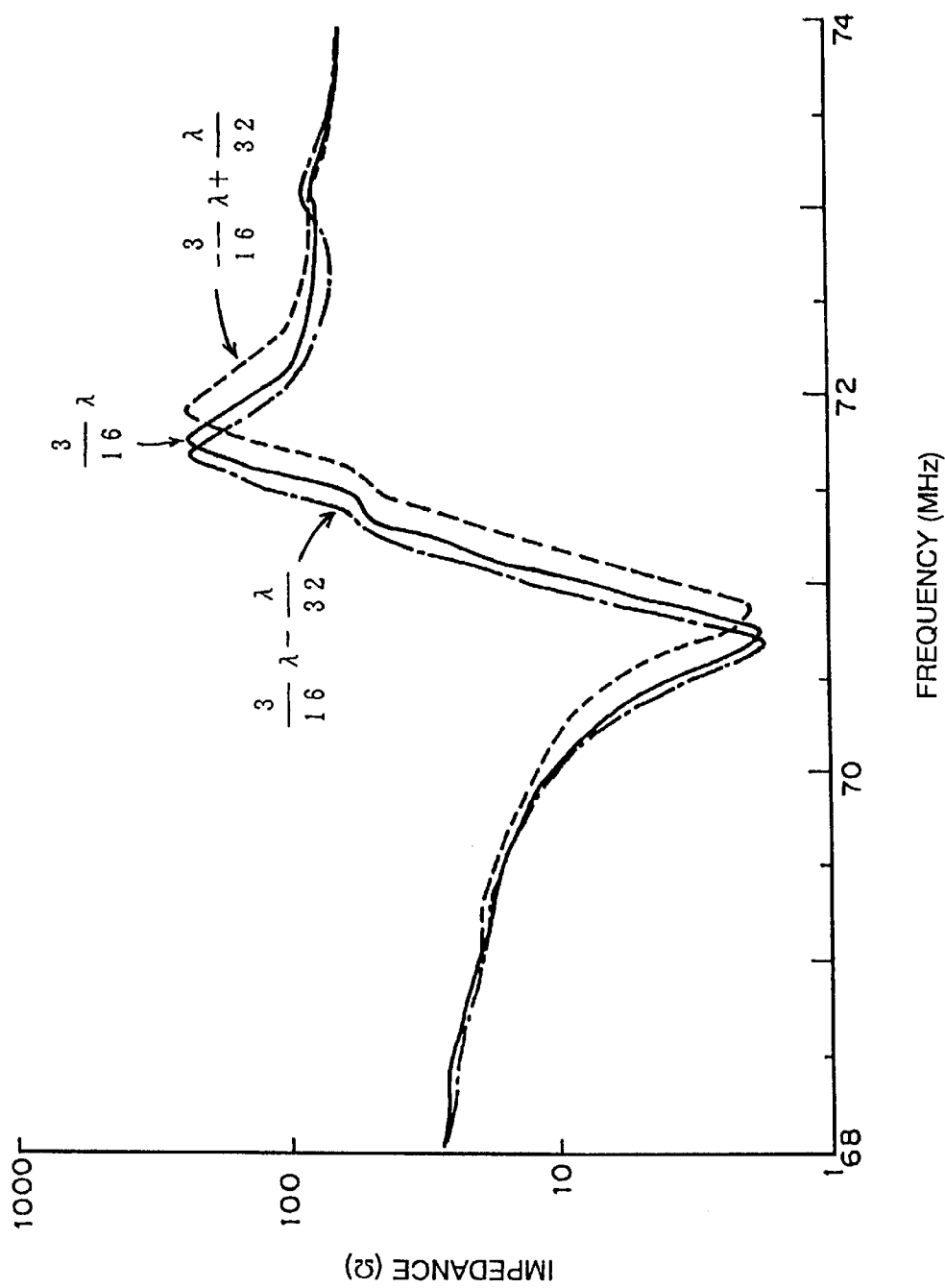
FIG. 6 is a graph showing the impedance-frequency characteristics of the edge-reflection type surface acoustic wave device, obtained when the widths of the electrode finger at the outermost side in the surface acoustic wave propagation direction are about $(3/16)\lambda$ and $(3/16)\lambda \pm \lambda/32$, respectively.

The Inventors of the present invention, considering that preferably, the widths of the electrode fingers at the outermost sides in the surface acoustic wave propagation direction are about (3/16)λ, investigated the range with respect to the above-mentioned width where similarly desirable characteristics can be obtained. As a result, as shown in FIG. 6, it was confirmed that the ripples appearing at the lower frequency side of the resonant frequency and at the higher frequency side of the anti-resonant frequency are minimized by using widths of the electrode fingers at the outermost sides in the surface acoustic wave propagation direction which are in the range of about (3/16)λ±(λ/32), and thus, the desirable characteristics comparable to those indicated by D in FIG. 5 are achieved.

In the above-described experimental example, in order to form the electrode fingers 4a and 3c at the outermost sides in the surface acoustic wave propagation direction, electrodes having a width larger than the final widths of the electrode fingers 4a and 3c were formed, respectively. Then, the piezoelectric substrate 2 was cut away to form the edge surfaces 2b and 2c and simultaneously, by the cutting of the wide electrodes, the widths of the electrode fingers 4a and 3c were determined. In this case, the outside edges of the electrode fingers 4a and 3c were aligned with the edge surfaces 2b and 2c, respectively.

However, according to preferred embodiments of the present invention, the outside edges of the electrode fingers 4a and 3c do not necessarily need to be aligned with the edge surfaces 2b and 2c. For example, when the above-described cutting is carried out, partial peeling or the like of the electrode films may occur between the electrode films and the edges of the piezoelectric substrate. If such peeling of the electrode films occurs, It may cause an undesirable influence on the frequency characteristics.

Figure 7:
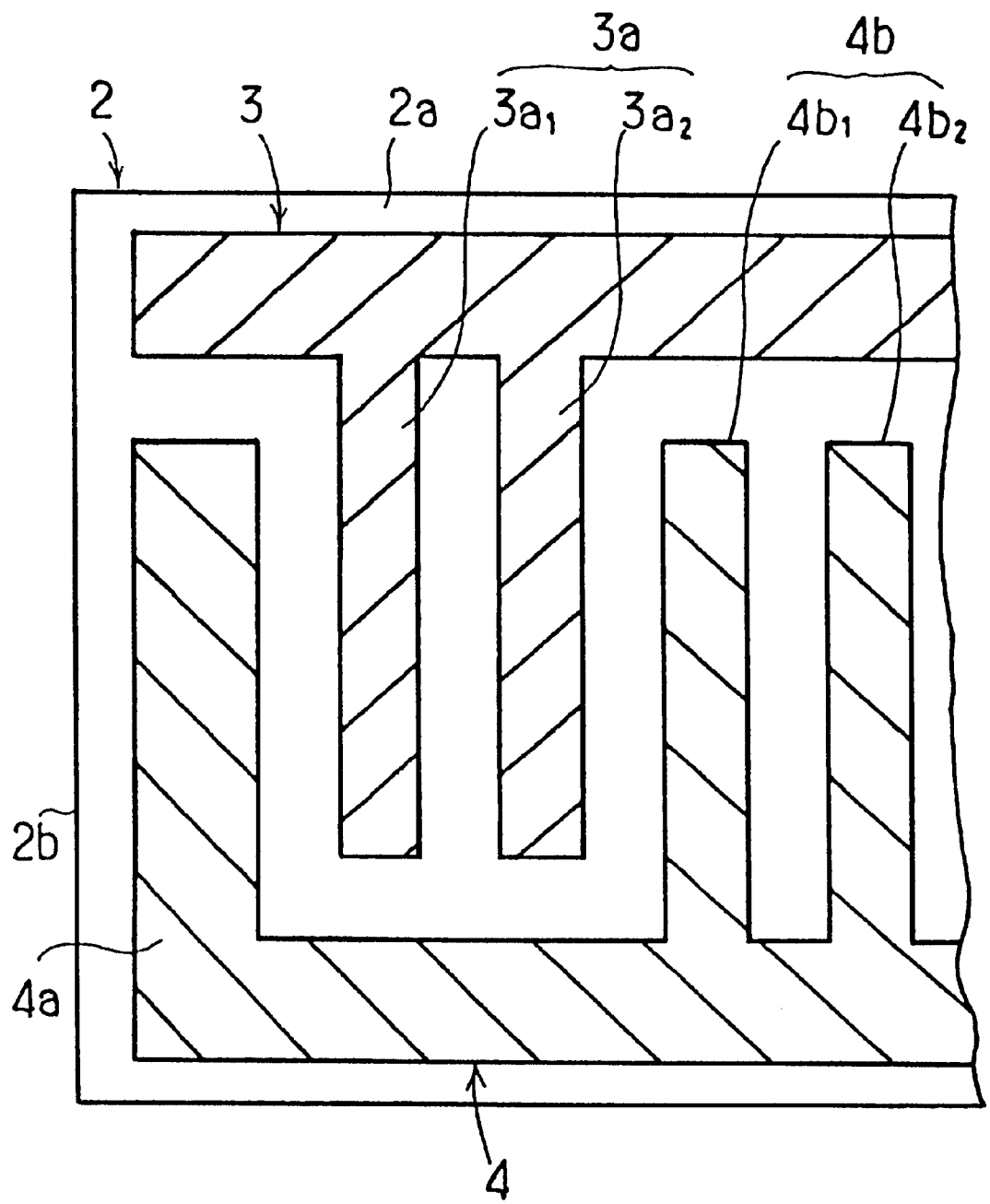
FIG. 7 is a partially cutaway plan view showing a modified example of the present invention in which the end surfaces of the edge-reflection type surface acoustic wave device are cut away so that a part of the piezoelectric substrate lies outside the electrode fingers on the outermost sides in the surface acoustic wave propagation direction.
Figure 8:
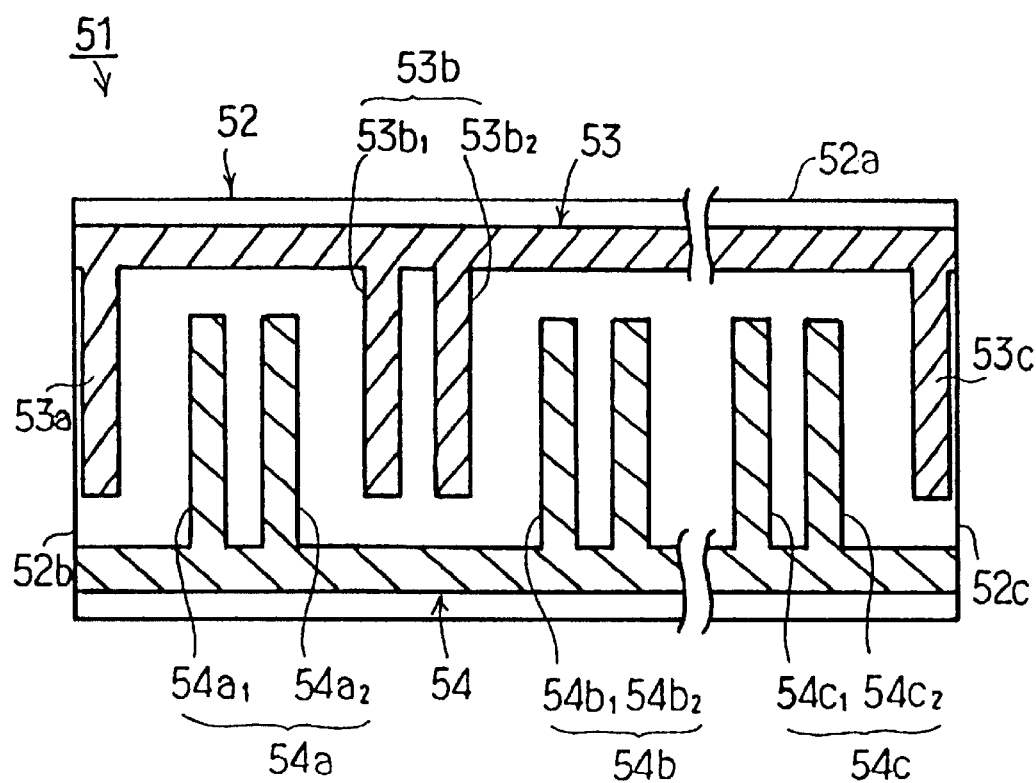
FIG. 8 is a plan view showing an example of conventional edge-reflection type surface acoustic wave resonator.

Accordingly, it is preferable that the edges 2b and 2c are cut so that a part of the piezoelectric substrate lies outside of the respective electrode fingers 4a and 3c at the outermost sides. For example, as shown in the partly enlarged front view of FIG. 7, the electrode finger 4a is arranged to have a desired size according to the above-described preferred embodiment. Thereafter, the piezoelectric substrate 2 is cut outside of the electrode finger 4a to form the edge surface 2b. Regarding the position of the end surface 2b, according to the specific examples of preferred embodiments made by the Inventors of the present invention, it has been confirmed that preferably, the position of the end surface 2b is set at up to λ/32 from the outside edge of the electrode finger 4a on the outermost side, and thereby, the above-described undesirable ripples in the frequency characteristics are effectively inhibited.

The above-described experimental example relates to the edge-reflection type resonator. The description is also applicable to other edge-reflection type surface acoustic wave devices such as a filter and other suitable components.

Conventionally, the split electrodes have been used to reduce multi-reflection between IDTs. It was previously thought that the split electrodes are not so suitable for use in resonator type filters.

However, the inventors discovered that by application of the split electrodes to the resonator type filters and ladder type filters which use the reflection of a surface acoustic wave having the SH wave as a major component from an end surface of such a device, a desirable standing wave is excited, and the band of the filter can be narrowed substantially without the insertion loss being deteriorated.

Another preferred embodiment in which the split electrodes are applied to the resonator type filter will be described below.

Figure 9:
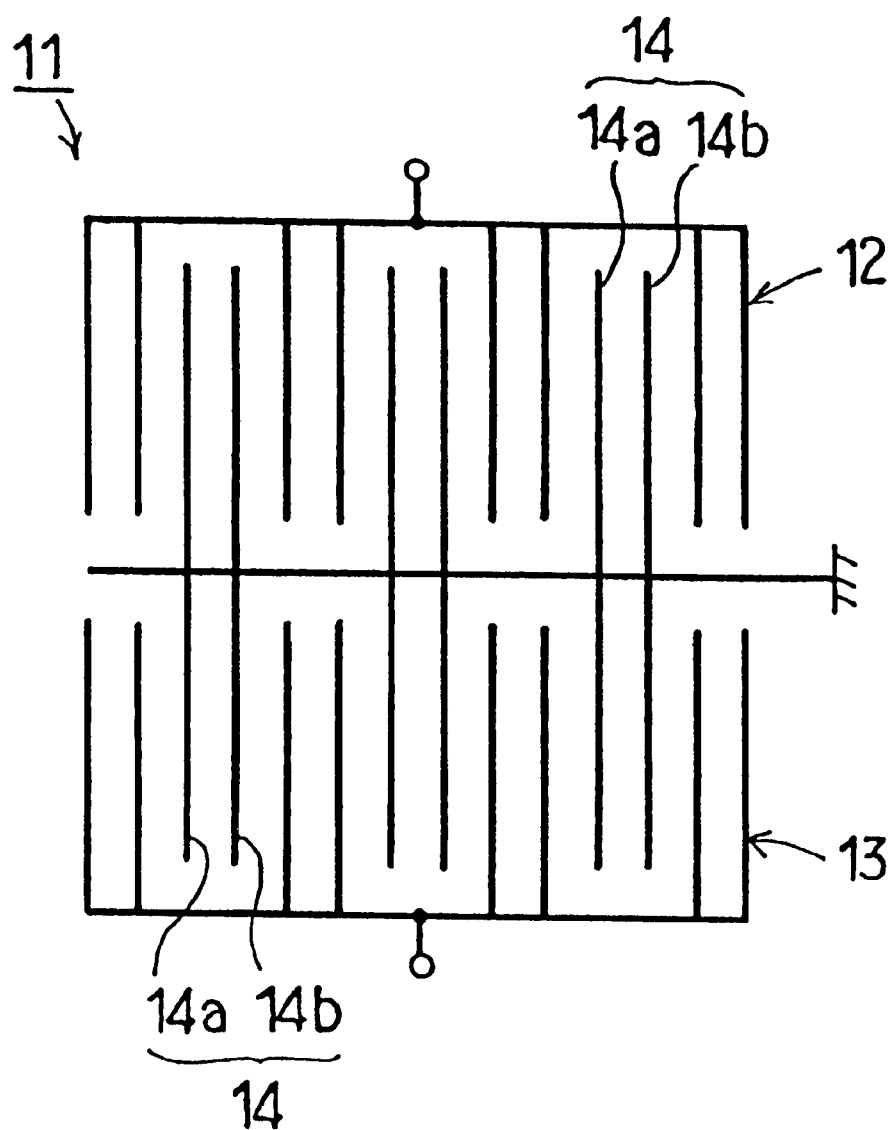
FIG. 9 is a plan view showing the arrangement of the electrodes of the edge-reflection type transversely coupled resonator filter including the split electrodes according to another preferred embodiment of the present invention.

FIG. 9 is a plan view showing a preferred embodiment of the present invention including an arrangement wherein electrodes of the edge-reflection type transversely coupled resonator filter including the split electrodes. As shown in FIG. 9, an edge-reflection type transversely coupled resonator filter 11 includes IDTs, having a structure similar to the structure shown in FIG. 1, arranged to define a two stage unit which extends in a direction that is substantially perpendicular to the surface acoustic wave propagation direction. That is, IDTs 12 and 13 are arranged to be substantially perpendicular to the surface acoustic wave propagation direction. Each electrode finger 14 of the respective IDTs 12 and 13 has a pair of split electrodes 14a and 14b.

Figure 10:
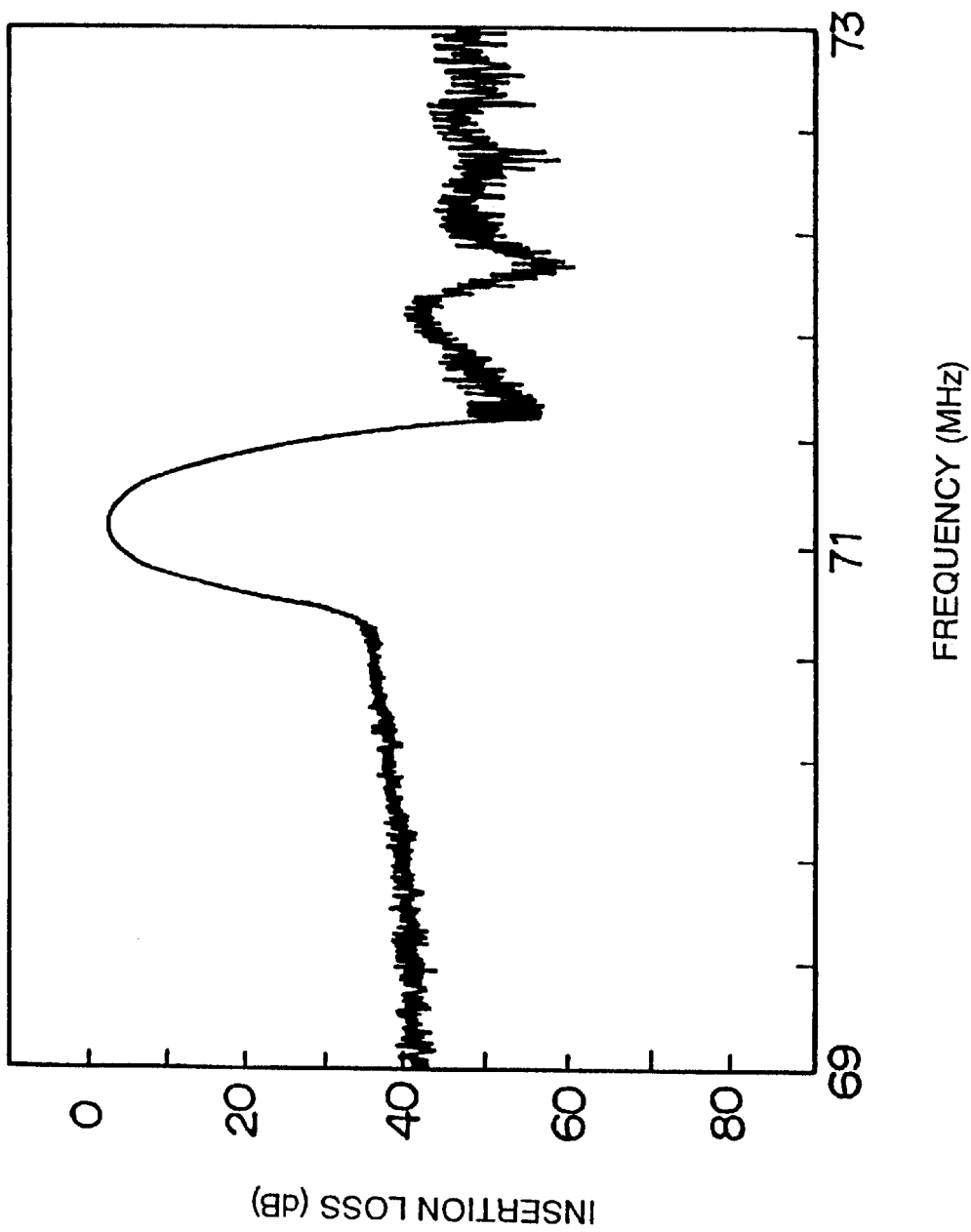
FIG. 10 is a graph showing the frequency characteristics of the edge-reflection type transversely coupled resonator filter including the split electrodes.
Figure 11:
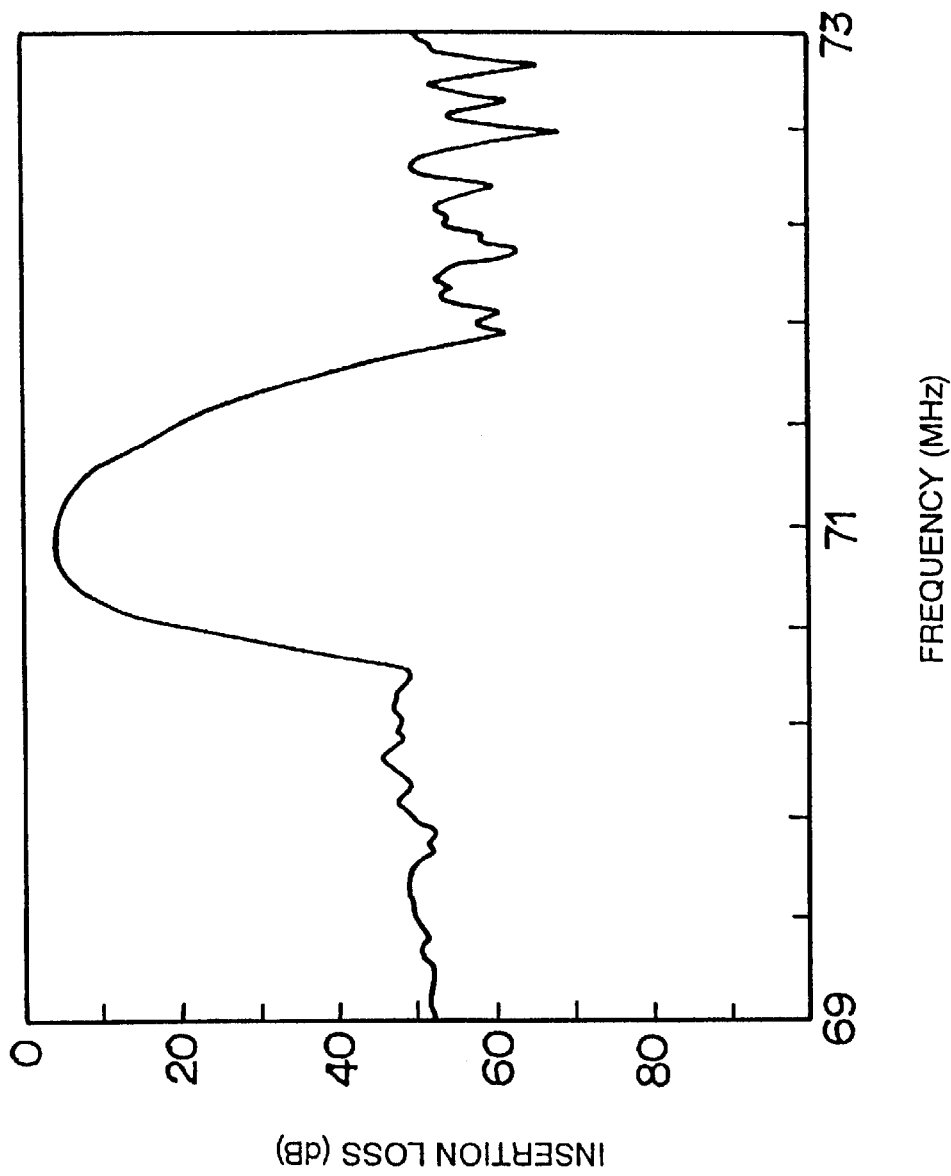
FIG. 11 is a graph of the edge-reflection type transversely coupled resonator filter including the single electrodes which is prepared for comparison to preferred embodiments of the present invention.

Hereinafter, the edge-reflection type transversally coupling resonator type filter 11 including the above split electrodes 14a and 14b will be compared to the edge-reflection type transversally coupling resonator filter including single electrodes each of which is composed of one electrode. FIG. 10 is a graph showing the frequency characteristics of the edge-reflection type transversely coupled resonator filter including the split electrodes according to the preferred embodiment shown in FIG. 9. FIG. 11 is a graph showing the frequency characteristic of the edge-reflection type transversely coupled resonator type filter which is configured similarly to the preferred embodiment of FIG. 9 except that the single electrodes are used as in the comparative example. With respect to the specific construction of the edge-reflection type transversely coupled resonator filters shown in FIGS. 10 and 11, an IDT having a configuration of a wavelength of about 30 μm, the number of pairs of 35, and the number of stages of 6 is formed on the piezoelectric substrate.

As understood by comparing FIG. 10 with FIG. 11, by using the split electrodes, the bandwidth is significantly narrowed even if the rest of the configuration of the filters is the same. For example, in the range of the insertion loss of 20 dB, the bandwidth is about 800 kHz as shown in FIG. 11, while the band is about 510 kHz as in FIG. 10. Thus, the band width is narrowed by about 63% in the preferred embodiment of the present invention shown in FIG. 9.

Figure 12:
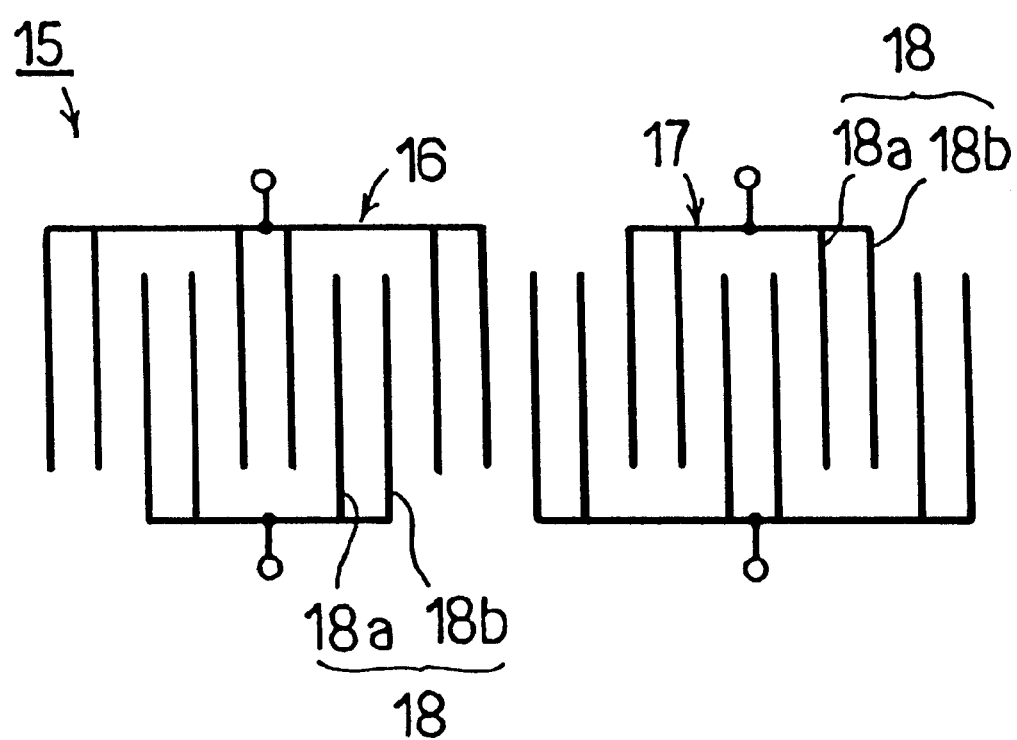
FIG. 12 is a plan view showing the arrangement of the electrodes of an end surface refection type longitudinally coupling resonator type filter using the split electrodes according to a further preferred embodiment of the present invention.

FIG. 12 is a plan view showing another preferred embodiment including an arrangement of the electrodes of the edge-reflection type transversely coupled resonator filter including the split electrodes. As shown in FIG. 12, an edge-reflection type longitudinal coupled resonator type filter 15 has IDTs, similar to that shown in FIG. 1, arranged to define a two stage unit extending in a direction that is substantially parallel to the surface acoustic wave propagation direction. That is, in the edge-reflection type longitudinally coupled resonator type filter 15, two IDTs are arranged to be substantially parallel to the surface acoustic wave propagation direction. Each electrode finger 18 of the IDTs 16 and 17 preferably has a pair of split electrodes 18a and 18b.

Figure 13:
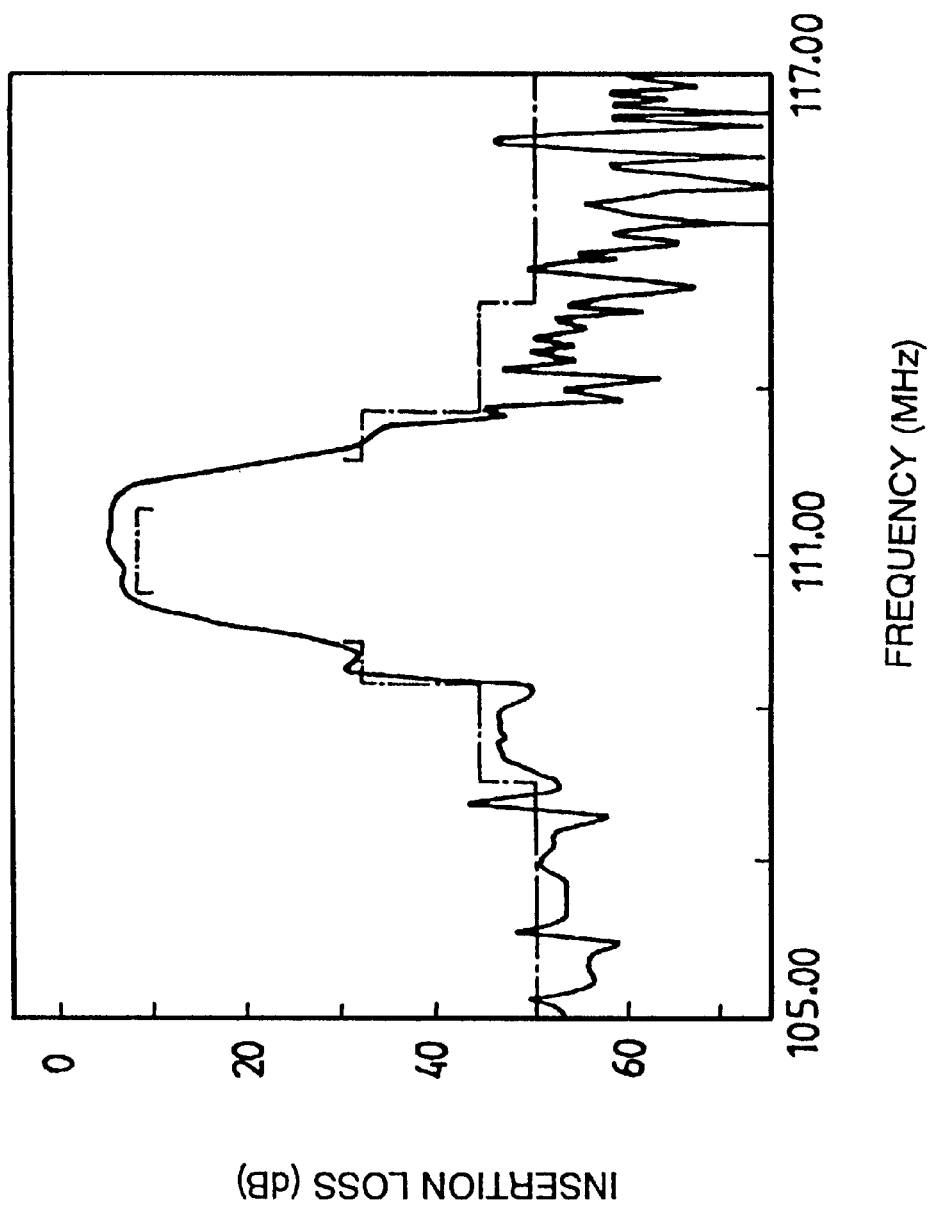
FIG. 13 is a graph illustrating the frequency characteristics of the edge-reflection type longitudinally coupled resonator type filter including the split electrodes.
Figure 14:
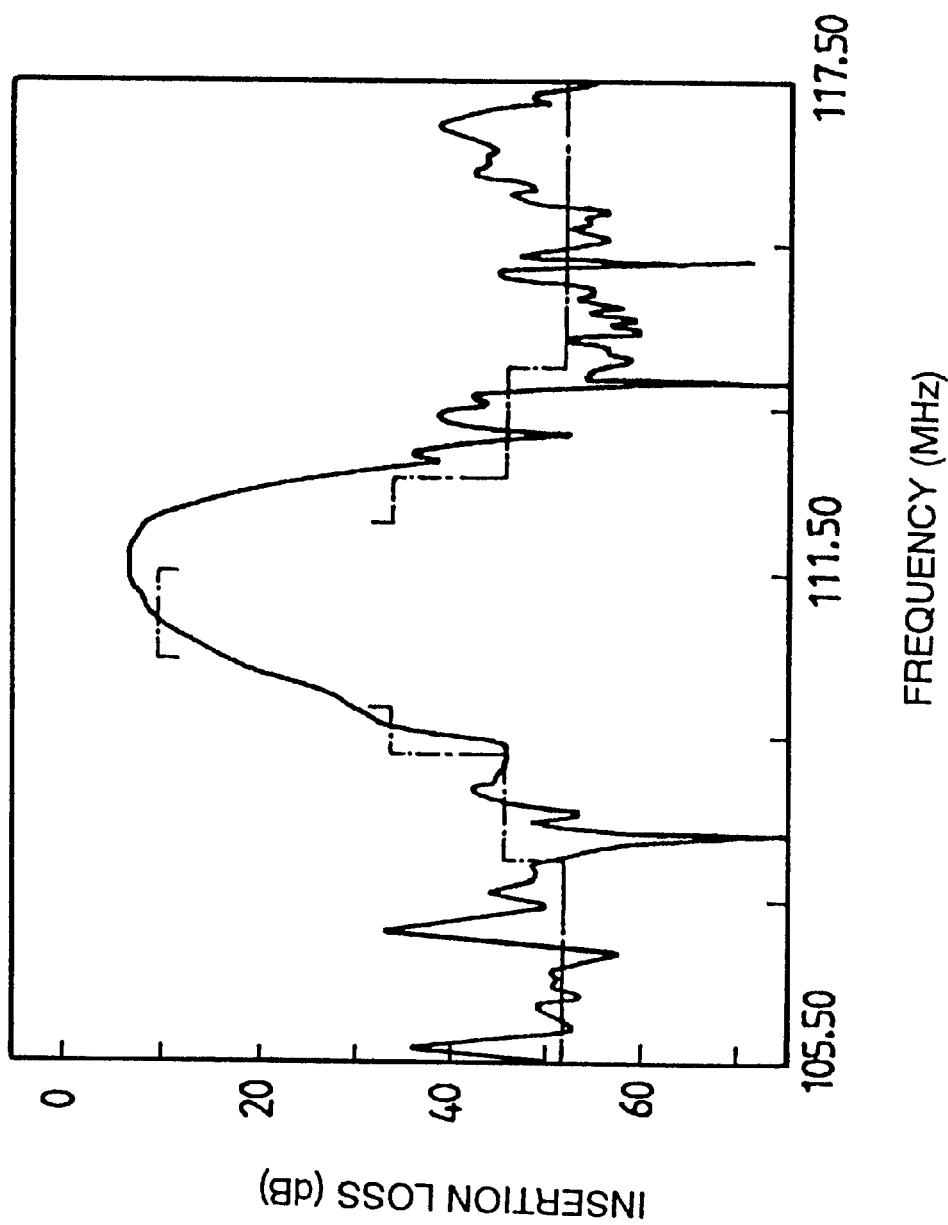
FIG. 14 is a graph illustrating the frequency characteristics of the edge-reflection type longitudinally coupled resonator type filter including the single electrodes which is prepared for comparison to preferred embodiments of the present invention.

Hereinafter, the edge-reflection type longitudinal coupling resonator type filter including the split electrodes according to the above-described preferred embodiment will be compared with the edge-reflection type longitudinal coupling resonator type filter including the single electrodes according to a comparative structure. FIG. 13 is a graph showing the frequency characteristics of the edge-reflection type longitudinal coupling resonator type filter including the split electrodes according to the preferred embodiment shown in FIG. 12. FIG. 14 is a graph showing the frequency characteristics of the edge-reflection type longitudinal coupling resonator type filter according to a comparative example which is arranged similarly to the preferred embodiment except that the single electrodes are used. The edge-reflection type longitudinally coupled resonator type filters shown in FIGS. 13 and 14 each are made of a 36° Y cut LiTaO3 substrate, and the wave-length is 40 μm, and the number of the electrode pairs is 36 (input and output). Further, each of the edge-reflection type longitudinal coupling resonator type filters has a two stage unit arrangement such as that shown in FIG. 12.

As seen in FIGS. 13 and 14, the bandwidth is significantly narrowed. More specifically, in the range of the insertion loss of 20 dB, the band of about 2.2 MHz shown in FIG. 14 is narrowed to about 2.0 MHz shown in FIG. 13. That is, the band is narrowed by about 90%. In addition, it is seen that with the narrowing, the attenuation outside the band is greatly improved.

Figure 15:
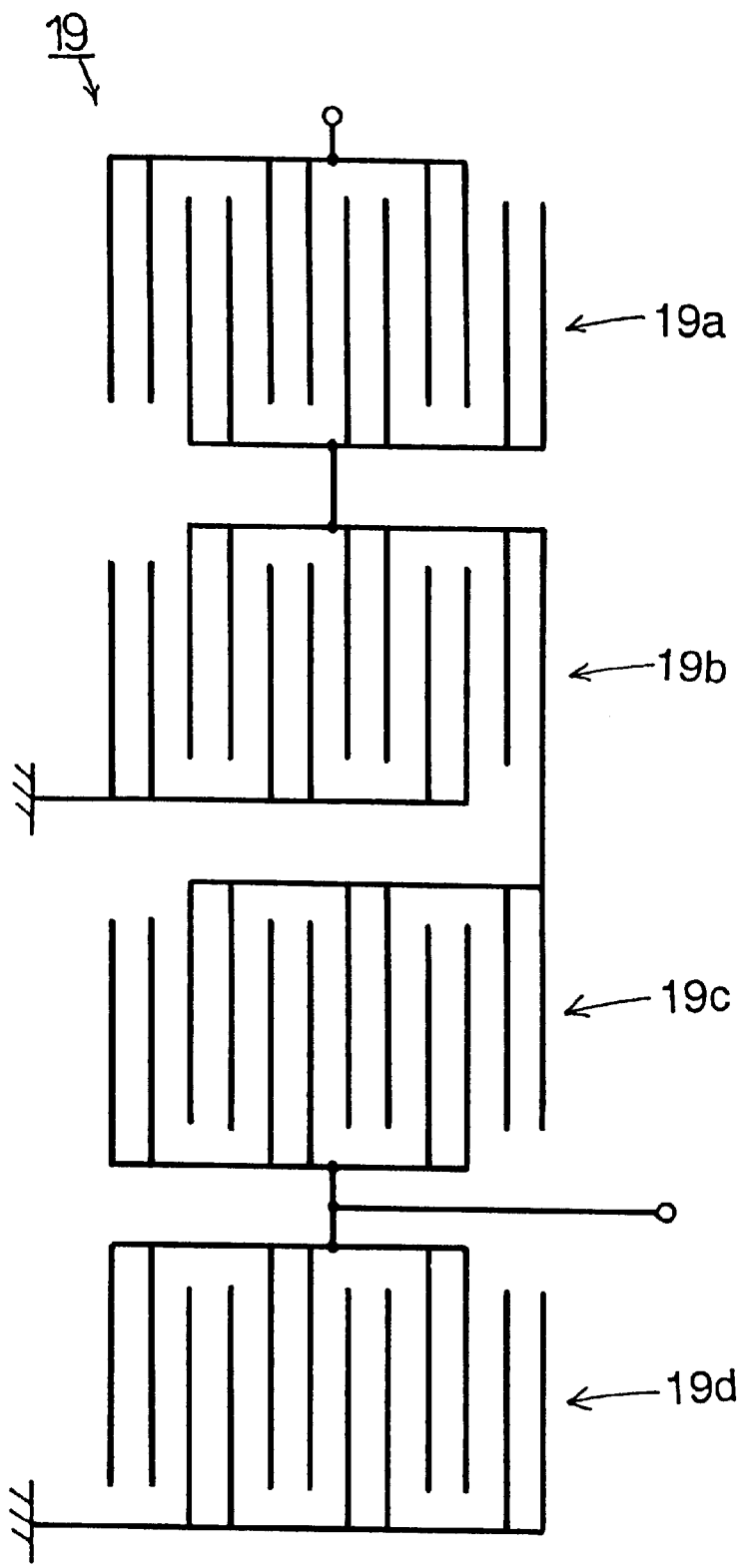
FIG. 15 is a plan view showing the arrangement of the electrodes of the edge-reflection type ladder type filter including the split electrodes according to another preferred embodiment of the present invention.

FIG. 15 is a plan view showing the arrangement of another preferred embodiment wherein the electrodes of the edge-reflection type ladder type filter include the split electrodes. As shown in FIG. 15, an edge-reflection type ladder type filter 19 has a plurality of IDTs, each having a structure similar to that shown in FIG. 1, arranged to define series arms 19a and 19c and parallel arms 19b and 19d to thereby produce a ladder circuit. In this ladder type filter 19, the band is greatly narrowed as in the transversely coupled resonator type filter 11 shown in FIG. 9 and also in the longitudinal coupling resonator type filter 15 of FIG. 12.

Heretofore, the edge-reflection type filter as an example has been described. However, even if a reflector is used as a reflection device, instead of the reflection end surface, the narrowing of the band can be realized and similar effects can be obtained although the insertion loss is deteriorated by about 1–2 dB.

Hereinafter, an example of an antenna duplexer including the ladder type filter of preferred embodiments of the present invention will be described with reference to FIG. 16.

Figure 16:
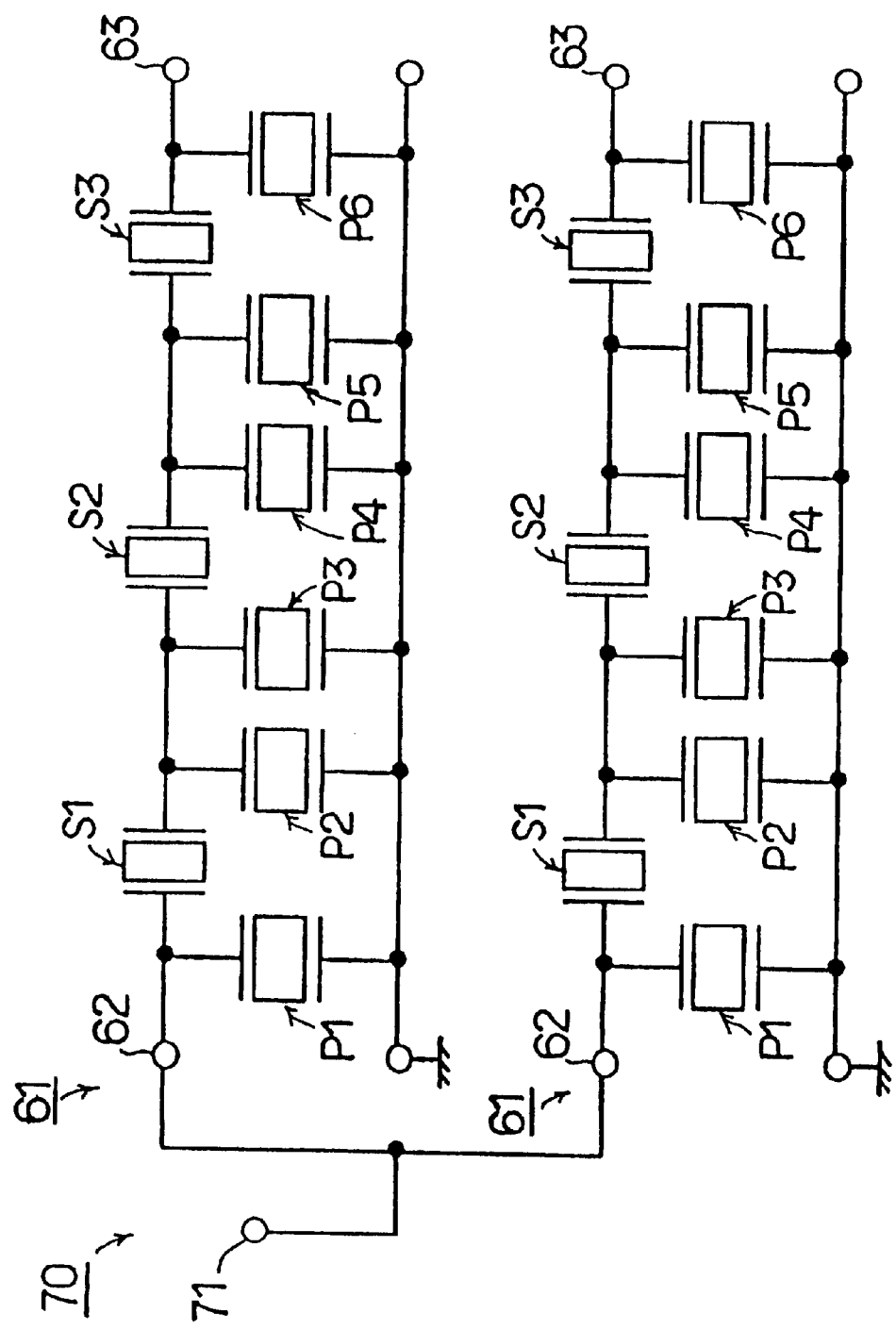
FIG. 16 is a schematic arrangement view illustrating the arrangement of an antenna duplexer which includes ladder type filters according to a preferred embodiment of the present invention.

FIG. 16 is a circuit diagram illustrating the antenna duplexer of the present preferred embodiment. An antenna duplexer 70 of the present preferred embodiment includes a pair of ladder type filters 61, at least one of which is preferably similar to the ladder type filter shown in FIG. 15. That is, the input terminals 62 and 62 of the respective ladder type filters 61 are connected in common so that a first port 71 is defined. On the other hand, the output terminals 63 and 63 of the respective ladder type filters 61 and 61 are used as they are, so that the second and third ports of the antenna duplexer of the present preferred embodiment are formed.

As described above, the antenna duplexer can preferably include a pair of the ladder type filters 61 and 61.

Figure 17:
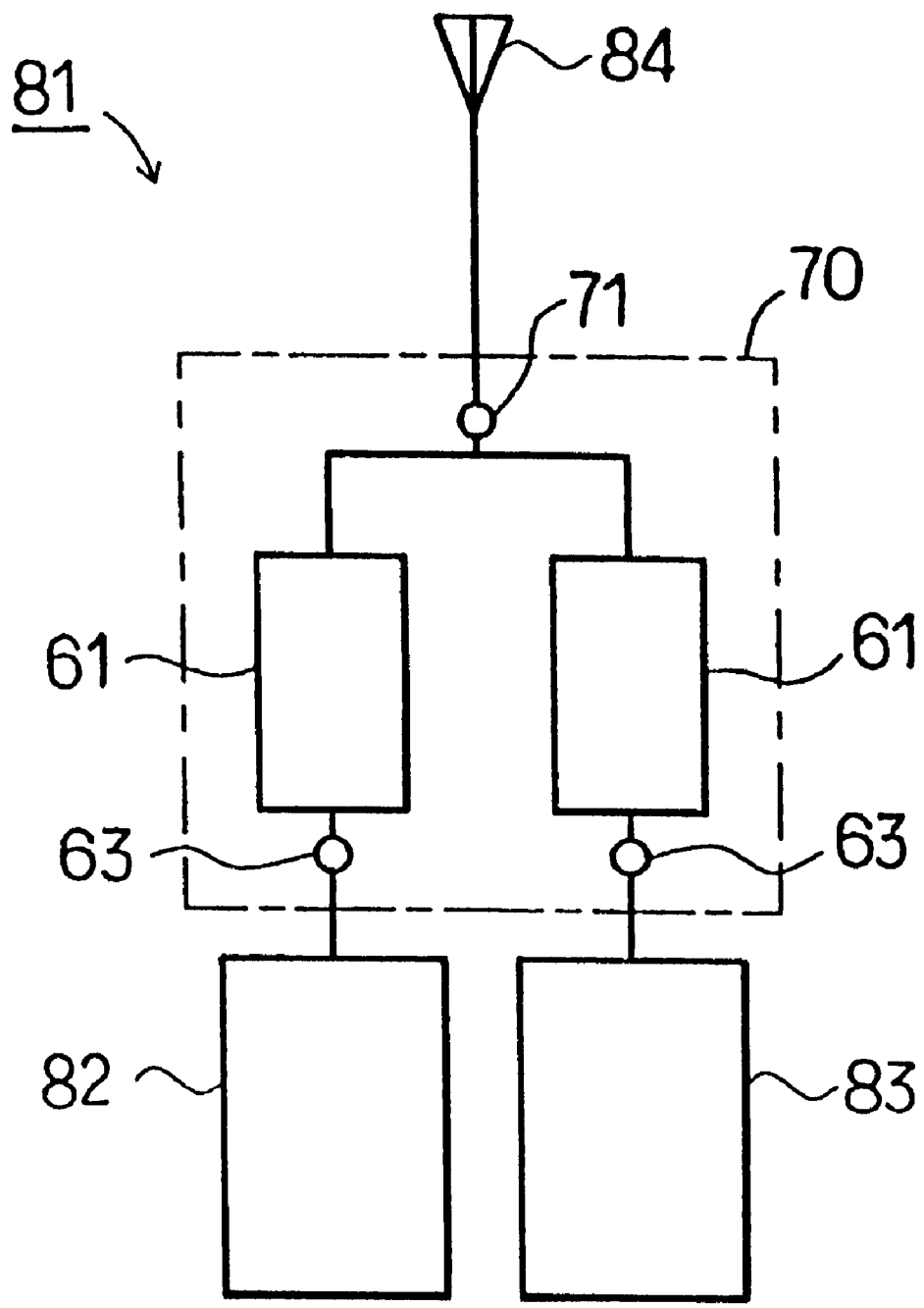
FIG. 17 is a schematic block diagram of a communication device including antenna duplexers according to another preferred embodiment of the present invention.

Further, a communication device can be defined by use of the above-described antenna duplexer. FIG. 17 shows an example of the communication device.

A communication device 81 of the present preferred embodiment is provided with an antenna duplexer 70, and transmitting or receiving circuits 82 and 83. The first port 71 of the antenna duplexer 70 is connected to an antenna 84. The output terminals 63 and 63, defining the second and third ports, are connected to the transmitting or receiving circuits 82 and 83, respectively.

In the antenna duplexer 70, a pair of the ladder type filters 61 and 61 are constructed so that the pass-bands are different from each other, and thereby, the antenna 84 can be used as the transmitting antenna and the receiving antenna.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a piezoelectric substrate having first and second main surfaces and two opposite edges which connect the first and second main surfaces; and
   an interdigital transducer including a pair of interdigital electrodes having electrode fingers and being disposed on the first main surface of the piezoelectric substrate and arranged so that the electrode fingers are interdigitated with each other; wherein
   the electrode fingers of the pair of interdigital electrodes include a plurality of split electrodes, except for the electrode fingers located at the outermost sides of the substrate along a direction of propagation of the surface acoustic wave produced in the substrate, the electrode fingers at the outermost sides having a width that is different from the split electrodes and extending in a direction parallel to the two opposite edges of the piezoelectric substrate.

2. A surface acoustic wave device according to claim 1, wherein the width of each of the split electrodes is about $\lambda/8$, and the width of each of the electrode fingers located at the outermost sides is greater than about $\lambda/8$, wherein $\lambda$ represents the wavelength of the surface acoustic wave.

3. A surface acoustic wave device according to claim 2, wherein the width of the electrode fingers at the outermost sides is within a range of greater than about $\lambda/8$ to about $\lambda/4$, wherein $\lambda$ represents the wavelength of the surface acoustic wave.

4. A surface acoustic wave device according to claim 3, wherein the width of the electrode fingers at the outermost sides is within the range $(3/16)\lambda \pm \lambda/32$, wherein $\lambda$ represents the wavelength of the surface acoustic wave.

5. A surface acoustic wave device according to claim 1, wherein the surface acoustic wave device is constructed to use a treble wave having a resonant frequency $f_0 = 3 \text{ v}/\lambda$, wherein $\lambda$ represents the wave length of the surface acoustic wave generated in the device and v represents a sound velocity.

6. A surface acoustic wave device according to claim 1, wherein the surface acoustic wave device is a longitudinally coupled resonator type filter.

7. A surface acoustic wave device according to claim 1, wherein the surface acoustic wave device is a transversally coupled resonator type filter.

8. A surface acoustic wave device according to claim 1, wherein the surface acoustic wave device is a ladder type filter.

9. A surface acoustic wave device according to claim 1, wherein the piezoelectric substrate is made of a piezoelectric single crystal material or a piezoelectric ceramic material.

10. A surface acoustic wave device according to claim 1, wherein outside edges of the outermost electrode fingers are aligned with end surfaces of the opposite edges of the substrate.

11. A surface acoustic wave device according to claim 1, wherein outside edges of the outermost electrode fingers are spaced from end surfaces of the opposite edges of the substrate.

12. A surface acoustic wave device according to claim 11, wherein a distance between outside edges of the outermost electrode fingers and respective end surfaces of the opposite edges of the substrate is about $\lambda/32$ or less, wherein $\lambda$ represents the wave length of the surface acoustic wave generated in the device.

13. A surface acoustic wave device according to claim 1, further comprising two or more interdigital transducers defining a two or more stage unit on the piezoelectric substrate and being arranged to extend in a direction that is substantially perpendicular to the direction of propagation of the surface acoustic wave.

14. A surface acoustic wave device according to claim 1, further comprising two or more interdigital transducers defining a two or more stage unit on the piezoelectric substrate and being arranged to extend in a direction that is substantially parallel to the direction of propagation of the surface acoustic wave.

15. A surface acoustic wave device according to claim 1, further comprising a plurality of interdigital transducers defining a ladder circuit on the piezoelectric substrate.

16. A surface acoustic wave device according to claim 15, wherein the plurality of interdigital transducers define a plurality of series arms and a plurality of parallel arms.

17. A duplexer comprising a surface acoustic wave device according to claim 1.

18. A communication device comprising the surface acoustic wave device according to claim 1.

19. A surface acoustic wave device comprising:
   a substrate having first and second main surfaces and two opposite edges which connect the first and second main surfaces; and at least one interdigital transducer including at least one pair of interdigital electrodes having electrode fingers and being disposed on the first main surface of the piezoelectric substrate and arranged so that the electrode fingers are interdigitated with each other; wherein the electrode fingers of the at least one pair of interdigital electrodes include a plurality of split electrodes and at least one single electrode disposed at each of the outermost sides of the substrate along a direction of propagation of the surface acoustic waves produced in the substrate, the electrode fingers at the outermost having a width that is different from the split electrodes and extending in a direction parallel to the two opposite edges of the substrate.

* * * * *